US008887016B1

United States Patent
Lai et al.

(10) Patent No.: US 8,887,016 B1
(45) Date of Patent: Nov. 11, 2014

(54) IC AND A METHOD OF TESTING A TRANSCEIVER OF THE IC

(75) Inventors: Thiam Sin Lai, Bayan Lepas (MY); Siew Leong Lam, Petaling Jaya (MY)

(73) Assignee: Altera Corporation, San Jose, CA (US)

( * ) Notice: Subject to any disclaimer, the term of this patent is extended or adjusted under 35 U.S.C. 154(b) by 320 days.

(21) Appl. No.: 13/372,354

(22) Filed: Feb. 13, 2012

(51) Int. Cl.
*H04L 1/24* (2006.01)

(52) U.S. Cl.
USPC .......................... 714/727; 714/726; 714/763

(58) Field of Classification Search
CPC .......................... H04L 1/0057; H03M 13/116
USPC .......................... 714/727, 725, 726, 763, 736
See application file for complete search history.

(56) References Cited

U.S. PATENT DOCUMENTS

| | | | |
|---|---|---|---|
| 4,857,716 A * | 8/1989 | Gombrich et al. | 235/375 |
| 5,481,186 A * | 1/1996 | Heutmaker et al. | 324/750.01 |
| 7,006,021 B1 * | 2/2006 | Lombaard | 341/100 |
| 7,560,952 B2 * | 7/2009 | Zhu et al. | 326/38 |
| 8,295,421 B1 * | 10/2012 | Lai et al. | 375/355 |

* cited by examiner

*Primary Examiner* — Fritz Alphonse
(74) *Attorney, Agent, or Firm* — Womble, Carlyle, Sandridge & Rice (57) ABSTRACT

An integrated circuit (IC) is provided. The IC includes a transceiver, a boundary scan chain and a plurality of routable pathways. The transceiver includes an interconnection coupling circuit components. The transceiver receives data and transfers the received data through the interconnection. The received data is utilized to test the interconnection between the circuit components. The transceiver deserializes the data once the data completes its propagation through the interconnection. The boundary scan chain receives and shifts the deserialized data from the transceiver and transfers the shifted deserialized data out of the IC. The shifting is performed when asserted with an instruction of an Input Output (IO) standard. The plurality of routable pathways provides a pathway between the transceiver and the boundary scan chain so that the deserialized data may propagate.

22 Claims, 7 Drawing Sheets

IC AND A METHOD OF TESTING A TRANSCEIVER OF THE IC

BACKGROUND

An Integrated circuit (IC) is tested to verify whether it functions properly. An IC can be tested in order to detect its defects, some of which may have been introduced from process variations when being manufactured. Testing may include two verification stages, e.g., functional verification and connectivity verification. The functional verification stage may be used to determine whether the IC is capable of functioning in its intended manner.

However, the connectivity verification determines whether interconnections within the IC or between ICs provide proper electrical connection. Typical connectivity verification utilizes boundary scan test method. The boundary scan test method verifies connectivity between interconnects on a printed circuit board (PCB) or between circuit blocks within the IC without using a physical test probe. The boundary scan testing can be implemented with design-for-test (DFT) circuitry such as, scan cells and Joint Test Action Group (JTAG) Test Access Port (TAP) controller.

However, applying boundary scan testing on the transceiver, which includes many interconnections that may need connectivity verification, can be challenging because of high frequency signal propagation within the transceiver. Furthermore, it is known that boundary scan registers built within the transceiver may compromise signal integrity when performing the boundary scan testing.

It is within this context that the embodiments described herein arise.

SUMMARY

Embodiments described herein provide an integrated circuit and a method of testing a transceiver of the integrated circuit. It should be appreciated that the present embodiments can be implemented in numerous ways, such as a process, an apparatus, a system, a device, or a method.

In one embodiment, an integrated circuit (IC) is provided. The IC includes a transceiver, a boundary scan chain and a plurality of routable pathways. The transceiver includes at least one interconnection coupling circuit components within the transceiver. The transceiver is operable to receive data and to transfer the received data through the interconnection. The received data is utilized to test the interconnection formed between the circuit components. The transceiver may be further operable to deserialize the data once the data completes its propagation through the interconnection. The boundary scan chain is operable to receive and shift the deserialized data from the transceiver and to transfer the shifted deserialized data out of the IC. The shifting is performed when asserted with an instruction of an Input Output (IO) standard. The plurality of routable pathways is operable to provide a pathway between the transceiver and the boundary scan chain so that the deserialized data may propagate.

In another embodiment, a method of testing a transceiver of an IC is provided. The method includes receiving a serial stream of data through the transceiver. The method further includes propagating the data through at least one interconnection that couples circuit components of a transceiver. The data is utilized to verify the interconnections. The method also includes deserializing the data to a parallel stream of data. The parallel stream of data is transferred to a plurality of boundary scan registers that forms a boundary scan chain. The parallel stream of data is then shifted through the plurality of boundary scan registers according to an IO standard.

In another embodiment, a method of testing a transceiver of an IC is provided. The method includes configuring a transceiver to receive data, e.g., using an Input Output (IO) circuitry. Data then propagates through circuit components of the transceiver to verify proper electrical connection between a circuit component and an interconnection. It is appreciated that the block may be compliant with an IO standard according to one embodiment. Test result data may be generated resulting from propagation of the data through circuit components of the transceiver. According to one embodiment, boundary scan chain shifts the test result data out of the IC.

Other aspects of the embodiments will become apparent from the following detailed description, taken in conjunction with the accompanying drawings, illustrating by way of example of the principles of the embodiments.

BRIEF DESCRIPTION OF THE DRAWINGS

The embodiments may be understood by reference to the following description taken in conjunction with the accompanying drawings.

DETAILED DESCRIPTION

The following embodiments describe an integrated circuit (IC) and a method of testing a transceiver of the IC. It will be obvious, however, to one skilled in the art, that the present embodiments may be practiced without some or all of these specific details. In other instances, well-known operations have not been described in detail in order not to unnecessarily obscure the present embodiments.

The current embodiment entails an IC that includes a transceiver. The IC may be configured to perform electrical verification of interconnections formed between circuit components within the transceiver. The resultant output, generated from the electrical verification, may be outputted from the IC via a particular Input Output (IO). In one embodiment, the IO may include boundary scan registers. The boundary scan registers available within the IO instead of transceiver ensures signal integrity of signals received/transmitted through the transceiver.

Figure 1:
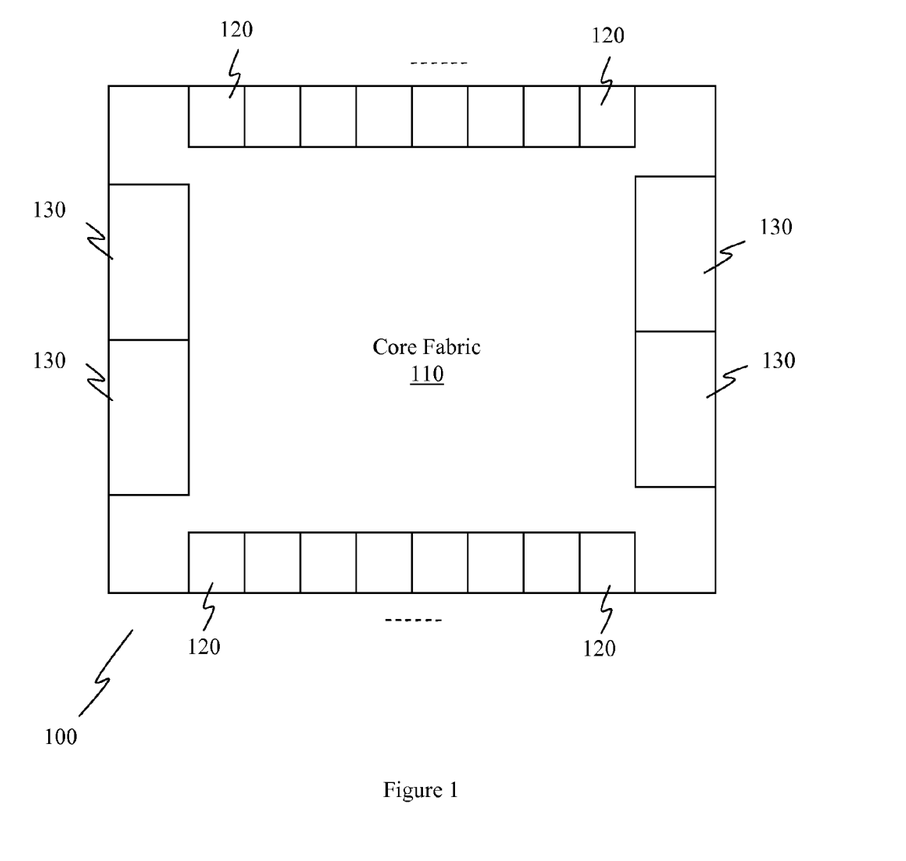
FIG. 1, meant to be illustrative and not limiting, illustrates an integrated circuit (IC) in accordance with one embodiment.

FIG. 1, meant to be illustrative and not limiting, illustrates an integrated circuit (IC) in accordance with one embodiment. IC 100 has a plurality of Input Outputs (IOs) 120, a plurality of transceivers 130 and a core fabric 110. In one embodiment, IC 100 may be a Programmable Logic Device (PLD) or a Field Programmable Gate Array (FPGA) device.

IOs 120 may be used to receive and/or transmit signals to and from IC 100. Signals at IOs 120 may have differing characteristics. For example, a first signal at IOs 120 may have a frequency and/or voltage level that is different from a second signal. In one embodiment, IOs 120 include boundary scan registers and Test Access Port (TAP) that can be used for boundary scan testing.

IOs 120 may be located at a periphery of IC 100. In one exemplary embodiment, IOs 120 are located at the upper and lower edges of the IC 100, as shown for IC 100.

Transceivers 130 are capable of receiving/transmitting high data rate signals to/from IC 100. It should be appreciated that the high data rate signals can be at least 100 Mega bit per second (Mbps). It should be appreciated that each transceiver 130 may include a transmitter circuitry, a receiver circuitry and as well as other circuitries, e.g., phase lock-loop (PLL), clock data recovery (CDR), etc.

Transceivers 130 may be available at the periphery of IC 100. In an exemplary embodiment, transceivers 130 are available at the left peripheral regions and the right peripheral regions of IC 100, as shown for IC 100. It should be appreciated that the placement of IOs 120 and transceivers 130 may vary from one design to the next and is not limited to the placement as illustrated in FIG. 1.

Core fabric 110 executes core functionality tasks of IC 100, e.g., storing data, performing programmed functions, etc. In one embodiment, core fabric 110 may include a plurality of logic elements (LEs). The LEs are programmable to execute functions, e.g., logical routines, electrical routing, etc. It should be appreciated that each of the LEs may include a plurality of interconnections and a plurality of registers.

Figure 2:
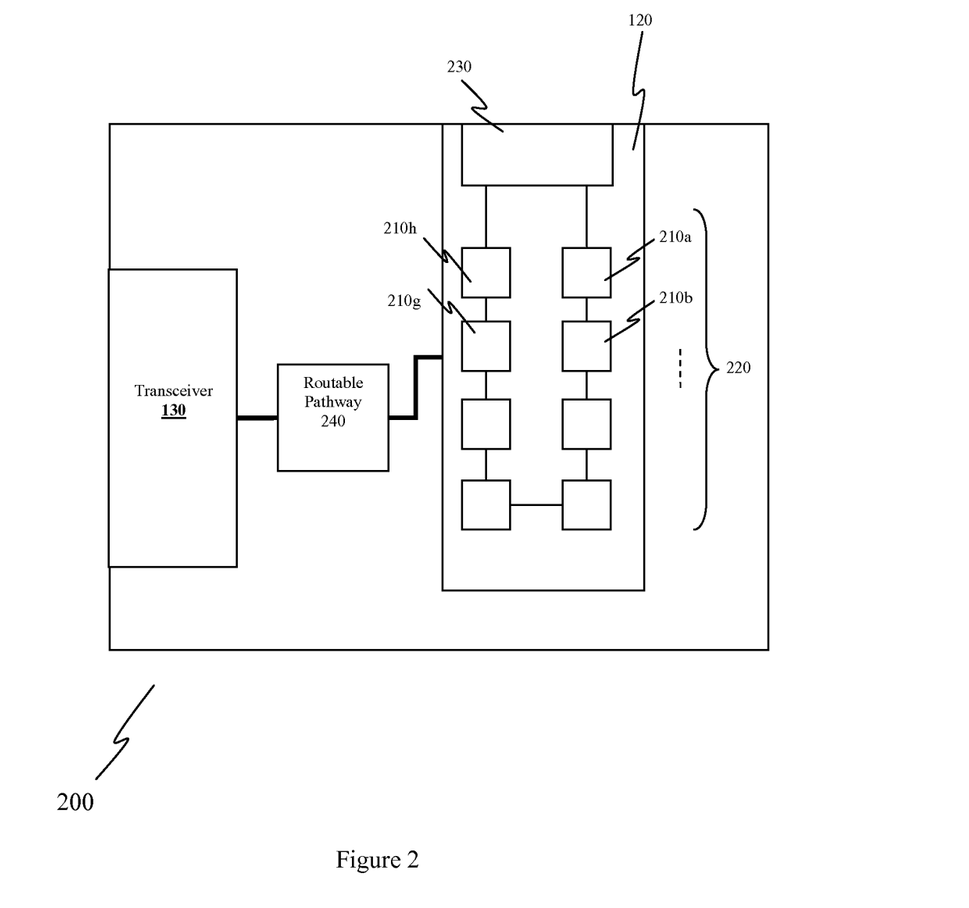
FIG. 2, meant to be illustrative and not limiting, illustrates circuitry within an IC in accordance with one embodiment.

FIG. 2, meant to be illustrative and not limiting, illustrates internal circuitry of an IC in accordance with one embodiment. In one embodiment, IC 200 includes transceiver 130, IO 120 and routable pathway 240. IO 120 may be used in testing IC 200. Transceiver 130 may be coupled to IO 120 through routable pathway 240 within IC 200.

It should be appreciated that IO 120 includes a plurality of circuitry. In one exemplary embodiment, IO 120 may include at least eight boundary scan registers 210a-210h, as shown in IC 200. Boundary scan registers 210a-210h, are coupled to form boundary scan chain 220, i.e., boundary scan register 210a is coupled to boundary scan register 210b; boundary scan register 210b is further coupled to boundary scan register 210c and so on, as shown in IC 200.

Transceiver 130 can be coupled to one of the boundary scan registers 210a-210h, e.g., through routable pathways 240. Bit signals may propagate from transceiver 130 and be routed to one of boundary shift registers 210a-210h. In one embodiment, a first bit is routed to boundary scan register 210a, a second bit is routed to boundary scan register 210b, and so on until an eighth bit is routed to boundary scan register 210h.

Routable pathway 240 may include a plurality of interconnections and programmable switches. Routable pathway 240 may enable a signal pathway between two circuit components within IC 200. The details on routable pathway 240 are not provided in further details in order not to obscure the purpose of the invention.

Still referring to FIG. 2, IO 120 further includes Joint Test Action Group (JTAG) controller 230, in one embodiment. JTAG controller 230 controls the manner in which the signal bit propagates within boundary scan chain 220, e.g., shifting of the signal bit along boundary scan registers 210a-210h. JTAG controller 230 may transfer input output (IO) signal bits into/out from IC 200. It should be appreciated that JTAG controller 230 may further includes Test Access Port (TAP). In accordance with the IEEE 1149.1 standard, the TAP includes 3 inputs, which is test data input (TDI), test data clock (TCK) and Test Mode State (TMS). The TAP may further include one output, which is test data out (TDO).

Figure 3:
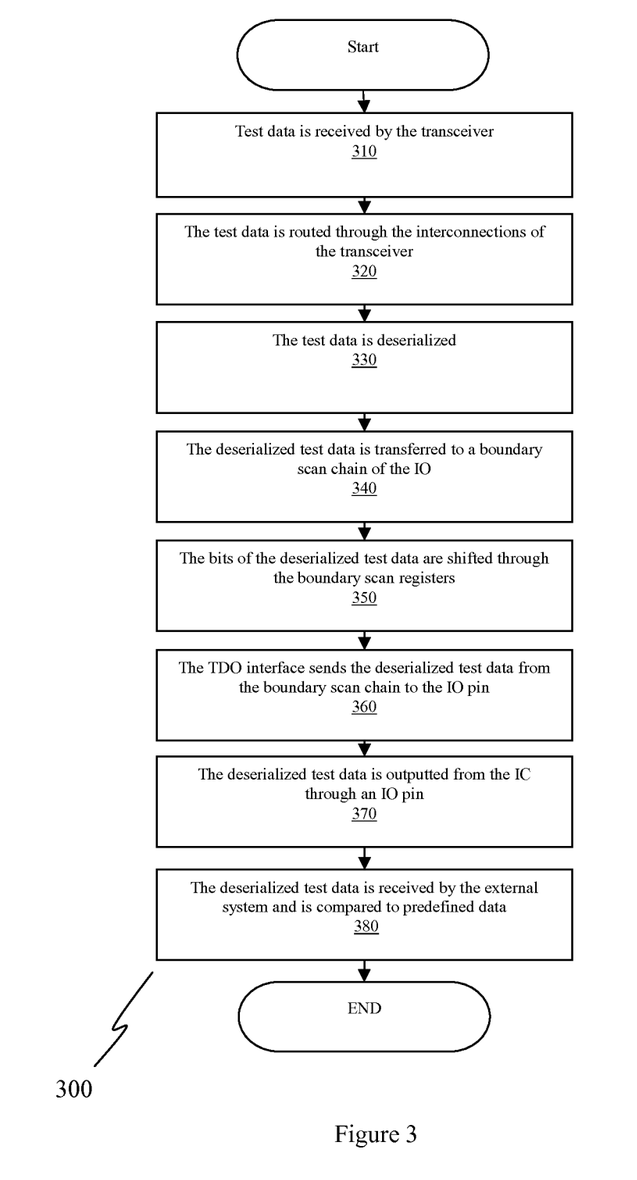
FIG. 3, meant to be illustrative and not limiting, illustrates a flowchart to test the transceiver of an IC in accordance with one embodiment.

FIG. 3, meant to be illustrative and not limiting, illustrates a method of testing the transceiver of an IC, in accordance with one embodiment. Method 300 may be applied to IC 200 of FIG. 2. At step 310, test data is received by a transceiver. In one embodiment, the test data is transmitted to the transceiver from an external source, e.g., a tester, signal generator, etc.

The test data is used to test the viability of the interconnections within the transceiver. The test data may include binary bit signals in the form of a serial bit stream in one embodiment. For example, the test data may be an eight bit serial data stream, e.g., '1011 1100', represented as 0xBC in hexadecimal. The test data is received by transceiver 130 at a high data rate, e.g., a rate of data propagation greater than 100 Mbps.

It should be appreciated that the circuitry within the transceiver, e.g., PLL, CDR, equalizer and etc., are coupled to each other through the interconnections that are to be tested. At step 320, the test data is routed through the interconnections of the transceiver. Routing the test data can be used in determining the connectivity and viability of the interconnections of the transceiver. The connectivity may be determined as electrically short or electrically open.

The test data value changes if the interconnection is defective. A defective interconnection is detected when an interconnection that is supposed to be electrically shorted is an electrically opened interconnection or vice versa. Accordingly, if no defective interconnection is detected, the test data that is routed through the interconnections will remain identical to the received test data.

At step 330, the test data is deserialized. Deserialization modifies a serial stream of data into a parallel stream of data. In one embodiment, the deserialization is performed by a deserializer circuit in the transceiver.

It should be appreciated that the transceiver may function at a high data rate whereas the remaining circuits operate at a low data rate. Therefore, the transceiver, in most instances, receives data that may be of higher frequency, which may not be process by the remaining circuitry. However, the remaining circuits within the IC are capable of parallel processing the data received from the transceiver. In one embodiment, the serial data stream of eight bits is deserialized into eight bits of parallel data.

At step 340, the deserialized test data is transferred to a boundary scan chain of the IO. The boundary scan chain may include boundary scan registers, e.g. boundary scan registers 210a-210h of FIG. 2. The deserialized test data is transferred to the IO using the routable pathway, e.g. routable pathway 240 of FIG. 2. The deserialized test data is received by the boundary scan registers in parallel data stream format. In one embodiment, the deserialized test data of eight bits is received sequentially by the boundary shift registers. For example, the first bit is received by a first boundary scan register, the second bit is received by a second boundary scan register, and so on until all eight bits of the deserialized test data are received by eight boundary scan register.

According to one embodiment, the deserialized test data is received by the boundary scan chain in response to a JTAG command, e.g., SAMPLE/PRELOAD command of IEEE 1139.1 standard. It should be appreciated that the SAMPLE/PRELOAD command may retrieve the deserialized test data without disrupting or interfering with the operation of the transceiver 120.

Still referring to FIG. 3, at step 350, the bits of the deserialized test data are shifted through the boundary scan registers. For example, the bit in the first boundary scan register is shifted to second boundary scan register, the bit in the second boundary scan register is shifted to third boundary scan register, and so on. It should be appreciated that each bit upon reaching the eight boundary scan register is shifted into the JTAG controller.

The deserialized test data is shifted synchronously, i.e., shifted when the clock signal transits from a logic low level to a logic high level. In one embodiment, the clock signal is derived from TCK input that is supplied by the JTAG controller. The JTAG controller has a TDO interface that is coupled to the IO pin of the IC. At step 360, the TDO interface sends the deserialized test data from the boundary scan chain to the IO pin.

At step 370, the deserialized test data is outputted from the IC through an IO pin. In one embodiment, the deserialized test data may be outputted to an external device, e.g., a tester. It should be appreciated that the deserialized test data may be outputted serially from the IO pin.

It should be appreciated that the JTAG controller can be a state machine controlling the manner in which the test data may flow within the IO. The state machine may include two states. The first state may control the manner in which the test data shifts within the boundary scan chain whereas the second state may control outputting the test data from the IC. For example, the first state controls the shifting of the bits from one boundary scan register to another, whereas the second state controls outputting of the test data. The state machine repeats the two states until the bits of the deserialized test data are transferred out of the JTAG controller. In one embodiment, the JTAG controller may change its state during the transition from a logic low value to a logic high value of the TCK input.

At step 380, the deserialized test data is received by the external system and is compared to predefined data. The comparison is used to detect defects in the interconnections of the transceiver. For example, the interconnections are determined to be fully functional and viable if the deserialized test data is identical to the predefined data. In comparison, the interconnections are determined to be defective if there is a mismatch between the deserialized test data and the predefined data.

It should be appreciated that the data rate that the serialized test data is received by the transceiver is significantly higher than the deserialized test data being transferred out. In one embodiment, the boundary scan chain includes eight boundary scan registers and receives the deserialized test data at least eight times faster than it outputs the test data.

Figure 4:
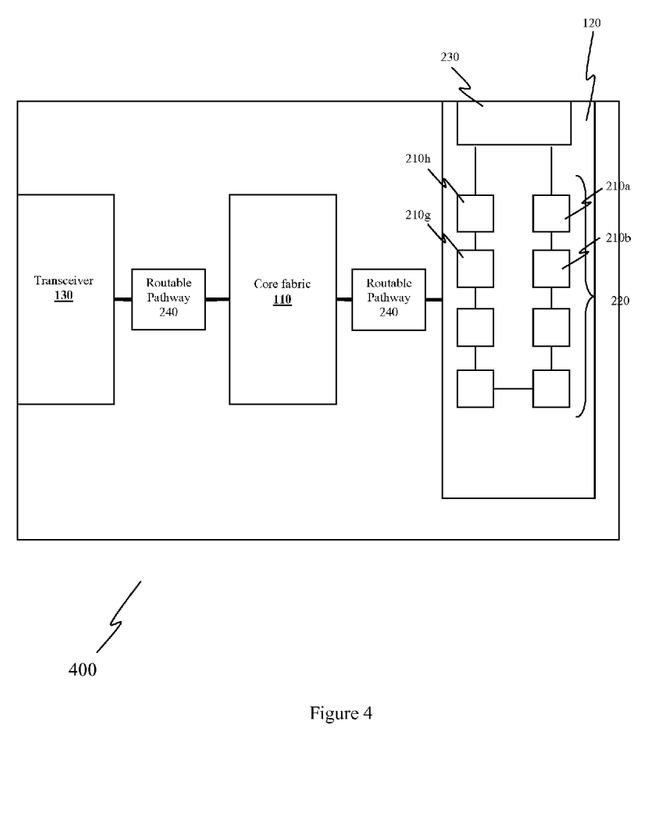
FIG. 4, meant to be illustrative and not limiting, illustrates an IC within a core fabric utilized in testing in accordance with one embodiment.

FIG. 4, meant to be illustrative and not limiting, illustrates an IC with a core fabric utilized in testing in accordance with one embodiment. In one embodiment, IC 400 may be similar to IC 200 of FIG. 2 that has core fabric 110.

Core fabric 110 may include a verification circuitry. In one embodiment, core fabric 110 may be programmable to include verification circuitry, when IC 400 is a programmable logic device. The verification circuitry may verify whether the test data being outputted from transceiver 130 matches the predefined data. The verification circuitry may be composed of a comparator for comparing the two. The verification circuitry generates a verification flag based on the comparison. In one embodiment, the verification flag may indicate that the two are either identical or a non-identical. Accordingly, the need to output the test data to the external device, as discussed with respect to FIGS. 2 and 3 for making the comparison is eliminated.

Figure 5:
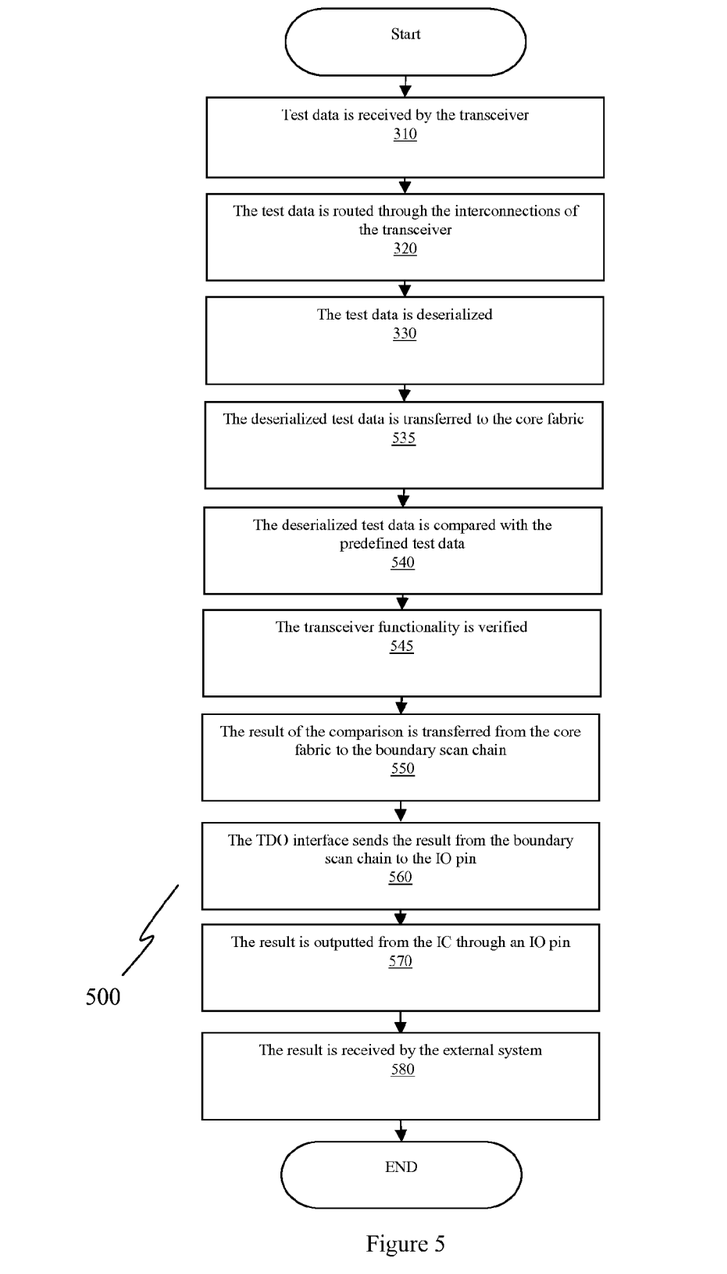
FIG. 5, meant to be illustrative and not limiting, illustrates a method for testing the transceiver of an IC with a verification circuitry in core fabric in accordance with one embodiment FIG. 6, meant to be illustrative and not limiting, illustrates a method of operating an IC to test the transceiver in accordance with one embodiment FIG. 7, meant to be illustrative and not limiting, illustrates an IC that further includes a multiplexer that is utilized for testing in accordance with one embodiment.

FIG. 5, meant to be illustrative and not limiting, illustrates a method for testing the transceiver of an IC with a verification circuitry in core fabric in accordance with one embodiment. In one embodiment, method 500 may be described by making reference to FIG. 4. It should be appreciated that method 500 is similar to that of method 300 described in FIG. 3 except as described below. Steps 310-330 in FIG. 5 are substantially similar to that of FIG. 3 and is not described here.

At step 535, the deserialized test data is transferred to the core fabric. For example, the deserialized test data may be transferred to the core fabric from the transceiver using routable pathways. The routable pathways may be programmed to transfer the deserialized test data in parallel.

Next, at step 540, the deserialized test data is compared with the predefined test data. In one embodiment, the verification circuitry described in FIG. 4 may be used to compare the deserialized test data to the predefined test data. It should be appreciated that the predefined test data is made available within the IC prior to the testing. The predefined test data matches the deserialized test data if the interconnections of the transceiver are defect free.

In one embodiment, each bit within the deserialized test data is compared to a respective bit within the predefined test data in a sequential manner. For example, the first bit of the deserialized test data is compared to the first bit of the predefined test data, the second bit of the deserialized test data is compared to the second bit of the predefined test data and so on. The sequential comparison of the bits may be used because the connectivity verification on the transceiver typically does not alter the chronological order of the test data bits.

A flag may be generated resulting from the comparison. In one embodiment, the comparison generates a first value, e.g., a bit value 0 or a bit value 1, a two bit value, etc., when the bits of the deserialized test data match the bits in the predefined test data. In contrast, the comparison generates a second value, e.g., a bit value 0 or a bit value 1, a two bit value, etc., when there is a mismatch between the deserialized test data and the predefined test data. The generated value indicates whether the interconnections within the transceiver are viable or defective.

At step 545, the transceiver functionality is verified. For example, the result of the comparison and the generated value (s) may be used in the verification process. The transceiver passes the connectivity testing if the flag indicates that there is a match between the deserialized test data and the predefined test data. On the other hand, it is indicated that the transceiver fails the connectivity testing if the comparison shows a mismatch.

At step 550, the result of the comparison, e.g., the flag value(s), is transferred from the core fabric to a boundary scan register of the boundary scan chain. The remaining portions of method 500 are similar to method 300 of FIG. 3 except that the verification flag is not transferred out in the embodiment of FIG. 5. In another embodiment, the verification flag and the deserialized test data are both output from the IC.

Steps 560-580 are similar to step 360-380 of FIG. 3 with the exception that the result of the comparison is outputted instead of the deserialized test data. Therefore, it should be appreciated that the manner where steps 560-580 will not be described in here.

Figure 6:
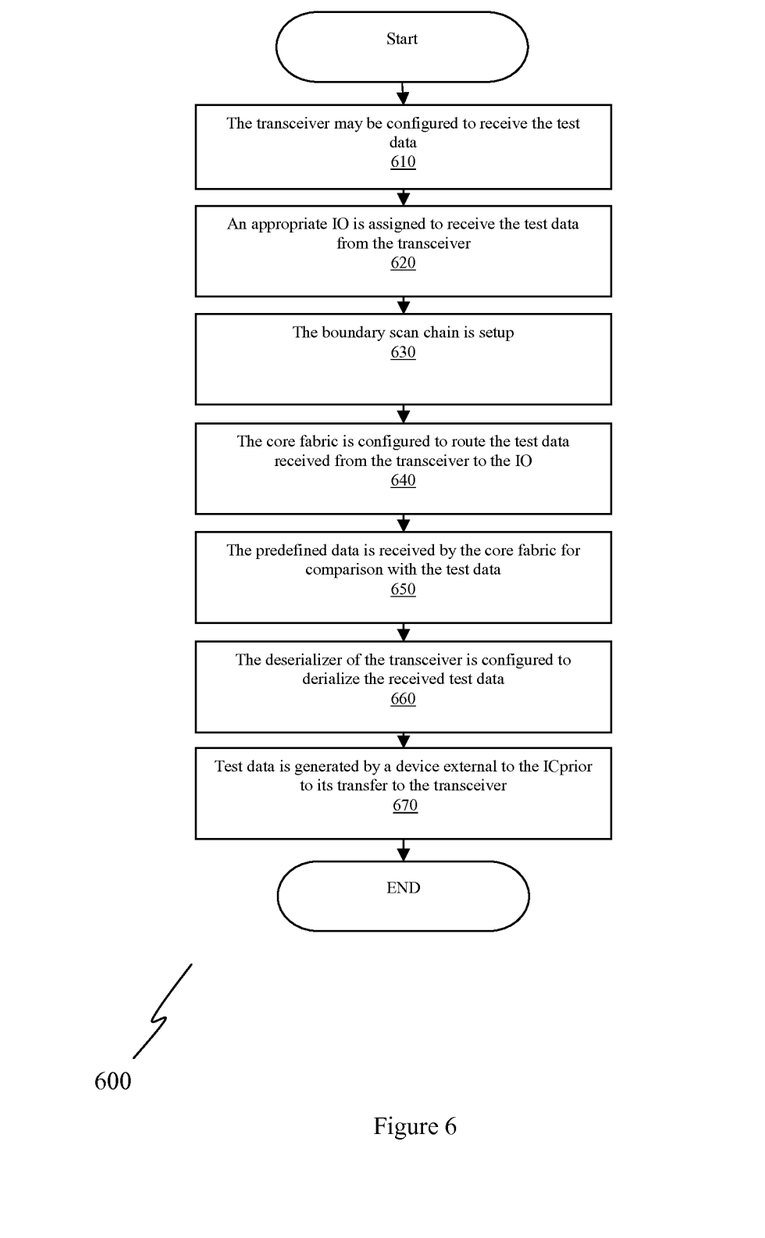

FIG. 6, meant to be illustrative and not limiting, illustrates a method of operating an IC to test the transceiver in accordance with one embodiment. In one embodiment, method 600 may be performed using a PLD device. Configuration information for implementing method 600 may be generated using an EDA tool and subsequently transferred to the IC, e.g., the PLD. The configuration information can be received by the IO in accordance with a standard such as JTAG standard. Accordingly, the PLD may be configured according to the configuration information to implement the method steps 600.

At step 610, the transceiver may be configured to receive the test data. The transceiver may be configured by placing the transceiver in a polling mode to receive test data and respond upon receiving the test data. The transceiver is also configured to provide routing pathways for test data to propagate through transceiver 130. It should be appreciated that the routing pathways is selected so that testing of a particular interconnection within the transceiver may be performed.

At step 620, an appropriate IO is assigned to receive the test data from the transceiver. In one embodiment, the IO is JTAG standard compliant and is assigned using test setup vectors, e.g., serial vector format (SVF) file. It should be appreciated that the SVF file may also include other configuration information.

At step 630, the boundary scan chain is setup. The boundary scan registers are coupled to each other via programmable interconnections for providing flexibility in providing pathways. In one embodiment, the boundary scan registers are set up as in the boundary scan registers 210a-210h of FIG. 2. It should be appreciated that not all the boundary scan registers may be utilized for setting up of the boundary scan chain and that the number of scan registers shown in FIG. 2 is exemplary and not intended to limit the scope of the present invention.

At step 640, the routable pathway is configured to route the test data received from the transceiver to the IO. A plurality of programmable switches and interconnections within the routable pathway may be configured to route the signals. In one embodiment, Configuration Random Access Memory (CRAM) bits may be used to program routable pathway to route the signals between the transceiver and the assigned IO. It should be appreciated that wide variety of considerations may be used in programming the routing pathway, e.g., how the routable pathway provides a shortest routing pathway from the transceiver to the IO, etc.

At step 650, predefined data is received by the core fabric for comparison with the test data. Core fabric may be configured to implement verification circuitry for performing the comparison. The verification circuitry includes an input terminal where it may receive the test data and it may further include a comparator circuit for comparing the predefined data and the test data. The verification circuitry may be implemented by configuring the LUTs.

At step 660, the deserializer of the transceiver is configured to derialize the received test data. It should be appreciated that the deserializer of the transceiver receives the test data and deserializes the test data to a parallel stream, e.g., from one stream of serial test data to eight steam of parallel test data.

At step 670, test data is generated by a device external to the IC, e.g., the PLD, prior to its transfer to the transceiver. Test data may be generated to induce a specific electrical stress on the connectivity of the interconnections. In one embodiment, the test data has a bit stream pattern such as having '1' in the sea of '0's, e.g., "00100000," "01000000," etc. However, in another embodiment, the test data may be randomly generated.

Figure 7:
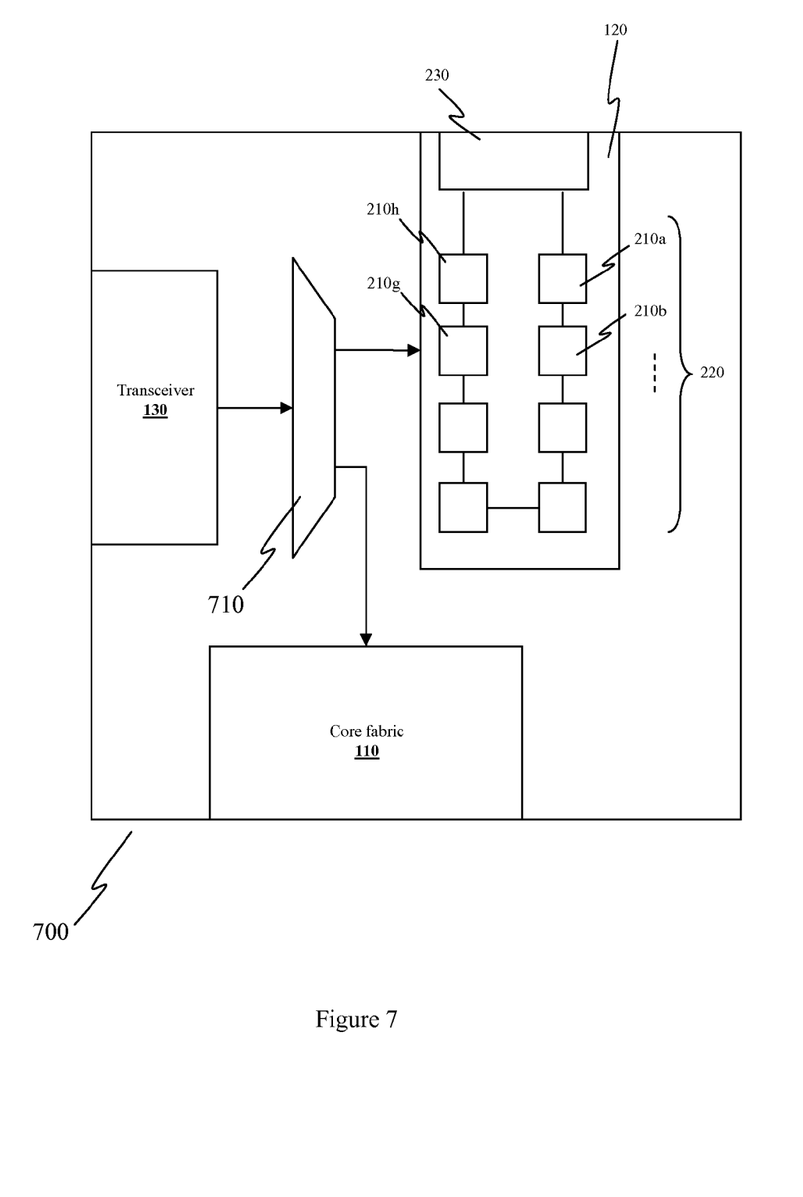

FIG. 7, meant to be illustrative and not limiting, illustrates an IC that further includes a multiplexer that is utilized for testing in accordance with one embodiment. IC 700 may be similar to the IC 400 of FIG. 4 with an addition of multiplexer 710. Multiplexer 710 may provide the flexibility of testing of transceiver 130 utilizing method 300 or 500 of FIGS. 3 and 5, respectively.

In one embodiment, multiplexer 710 may be used to control whether the test data is transferred to IO 120 or to core fabric 110. The selection made by multiplexer 710 is made in accordance with the control signals received by multiplexer 710. The control signals for controlling the operation of multiplexer 710 may be based on IC's 700 mode of operation, e.g., test mode, production mode, etc. It should be appreciated that having such implementation on an ASIC or ASSP enables connectivity verification of the transceiver utilizing JTAG standard.

The embodiments, thus far, were described with respect to integrated circuits. The method and apparatus described herein may be incorporated into any suitable circuit. For example, the method and apparatus may be incorporated into numerous types of devices such as microprocessor, programmable logic devices (PLDs), application specific standard products (ASSPs) or application specific integrated circuits (ASICs). Exemplary of programmable logic devices include programmable arrays logic (PALs), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs)—just to name a few.

The programmable logic device described herein may be part of a data processing system that includes one or more of the following components; a processor; memory; IO circuits; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by the assignee.

Although the method of operations were described in a specific order, it should be understood that other operation may be performed in between described operations, described operations may be adjusted so that they occur at slightly different times or described operations may be distributed in a system which allows occurrence of the processing operation at various intervals associated with the processing, as long as the processing of the overlay operations are performed in a desired way.

Although the foregoing invention has been described in some detail for the purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. An integrated circuit (IC) comprising:
a transceiver comprising an interconnection for coupling circuit components within the transceiver, wherein the transceiver is configured to receive data and to transfer the received data through the interconnection, and wherein the transceiver is further configured to deserialize the received data to form a deserialized data, wherein the received data is utilized for testing whether the interconnection is defective;

a boundary scan chain configured to receive the deserialized data and to shift the deserialized data out of the IC, wherein the shifting is performed based on an Input Output (IO) standard; and a routable circuitry configured to provide a pathway for the deserialized data between the transceiver and the boundary scan chain, the routable circuitry having a plurality of programmable switches.

2. The IC in claim 1 further comprising:
a core fabric configured to receive the deserialized data from the transceiver, wherein the core fabric is further configured to compare the deserialized data with a predefined data to generate a comparison result output comparison.

3. The IC in claim 2 further comprising:
a multiplexer configured to receive the deserialized data from the transceiver and to transfer the deserialized data to a boundary scan of the boundary scan chain or to the core fabric.

4. The IC in claim 1, wherein the boundary scan chain comprises a plurality of boundary scan registers forming a chain, wherein each boundary scan register is configured to receive a bit of the deserialized data.

5. The IC in claim 1 further comprising:
a Joint Test Action Group (JTAG) controller configured to control the deserialized data propagations within the boundary scan chain.

6. The IC in claim 1, wherein the IO standard is a Joint Test Action Group (JTAG) standard.

7. A method of testing a transceiver of an integrated circuit (IC), said method comprising:
receiving a serial stream of data through the transceiver of the IC;
propagating the data through an interconnection coupling circuit components within the transceiver, wherein the data is utilized to test whether the interconnection is defective;
deserializing the data to a parallel stream of data;
transferring the parallel stream of data from the transceiver to a boundary scan chain via routable circuitry having programmable switches; and
shifting the parallel stream of data through the boundary scan chain according to a first Input Output (IO) standard instruction.

8. The method in claim 7, wherein the IO standard is a Joint Test Action Group (JTAG) standard.

9. The method in claim 7 further comprising:
receiving predefined data;
transferring the predefined data and the parallel stream of data to a core fabric within the IC; and
comparing the parallel stream of data and the predefined data.

10. The method in claim 9 further comprising:
determining whether the interconnection is defective based on the comparison of the parallel stream of data and the predefined data.

11. The method in claim 7 further comprising:
sampling the parallel stream of data at the transceiver after receiving a second IO standard instruction.

12. The method in claim 7 further comprising:
outputting the parallel stream of data to a component external to said IC.

13. The method in claim 12 further comprising:
comparing the parallel stream of data and an expected data within the external system; and
determining whether the interconnection is defective based on the comparison of the parallel stream of data and the expected data.

14. The method in claim 7, wherein the shifting of the parallel stream of data in the boundary scan chain occurs when a clock signal transitions from a first logic level to a second logic level.

15. A method to test a transceiver of an integrated circuit (IC), said method comprising:
receiving test data;
propagating the test data to determine whether one or more electrical connections within the transceiver is defective;
transferring the test data from the transceiver to an Input Output (IO) circuitry, wherein the IO circuitry is compliant with an IO standard;
coupling the transceiver to the IO circuitry through a signal pathway configured in routable circuitry having programmable switches; and
shifting the test data out of the IC using a boundary scan chain.

16. The method in claim 15, wherein said boundary scan comprises a plurality of boundary scan registers.

17. The method in claim 15 further comprises:
receiving predefined data at a core fabric of the IC, wherein the core fabric is configured to compare the test data received from the transceiver to the predefined data.

18. The method in claim 17, wherein said one or more electrical connections is determined to be non-defective if the test data received from the transceiver is equivalent to the predefined data.

19. The method in claim 15, wherein at least one of the receiving, propagating, coupling, and shifting is performed using an Electronic Design Automation (EDA) tool.

20. The method in claim 15, wherein the pathway that couples the transceiver and the IO circuitry includes the routable circuitry.

21. The method in claim 15, wherein the IO standard is a Joint Test Action Group (JTAG) standard.

22. The method in claim 15 further comprising:
deserializing the test data into a parallel stream of test data, wherein said deserializing occurs in the transceiver.

* * * * *